(12) United States Patent
Ohba et al.

(10) Patent No.: US 9,203,018 B2
(45) Date of Patent: *Dec. 1, 2015

(54) MEMORY ELEMENT AND MEMORY DEVICE

(71) Applicant: Sony Corporation, Tokyo (JP)

(72) Inventors: Kazuhiro Ohba, Miyagi (JP); Takeyuki Sone, Miyagi (JP); Masayuki Shimuta, Kanagawa (JP); Shuichiro Yasuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/196,240

(22) Filed: Mar. 4, 2014

(65) Prior Publication Data

US 2014/0183437 A1 Jul. 3, 2014

Related U.S. Application Data

(63) Continuation of application No. 13/416,502, filed on Mar. 9, 2012, now Pat. No. 8,699,260.

(30) Foreign Application Priority Data

Mar. 18, 2011 (JP) ................. 2011-061628

(51) Int. Cl.
*G11C 11/00* (2006.01)
*H01L 45/00* (2006.01)
(Continued)

(52) U.S. Cl.
CPC ............ *H01L 45/08* (2013.01); *G11C 13/0069* (2013.01); *G11C 16/0466* (2013.01); *G11C 16/3418* (2013.01); *H01L 27/2436* (2013.01); *H01L 27/2472* (2013.01); *H01L 45/085* (2013.01); *H01L 45/1233* (2013.01);
(Continued)

(58) Field of Classification Search
CPC .......... G11C 13/0011; G11C 2213/55; G11C 13/0069; G11C 16/0466; H01L 45/085; H01L 45/1266; H01L 45/142; H01L 45/143; H01L 45/144; H01L 45/146
USPC ................. 365/148, 158, 182, 100, 180, 199
See application file for complete search history.

(56) References Cited

U.S. PATENT DOCUMENTS 8,699,260 B2 *  4/2014  Ohba et al. ................... 365/148
2011/0194329 A1   8/2011  Ohba et al.

FOREIGN PATENT DOCUMENTS

JP  2005-518671  6/2005
JP  2009-043905  2/2009

OTHER PUBLICATIONS

Japanese Office Examination Report issued in connection with related Japanese Patent Application No. 2011-061628 dated Nov. 4, 2014.

(Continued)

*Primary Examiner* — Thong Q Le
(74) *Attorney, Agent, or Firm* — Dentons US LLP

(57) ABSTRACT

A memory element with a first electrode, a memory layer, and a second electrode in this order. The memory layer includes a resistance change layer provided on the first electrode side, an ion source layer provided on the second electrode side, an intermediate layer provided between the resistance change layer and the ion source layer, and a barrier layer provided at least either between the ion source layer and the intermediate layer, or between the intermediate layer and the resistance change layer.

17 Claims, 8 Drawing Sheets

(51) Int. Cl.
    *H01L 27/24*     (2006.01)
    *G11C 13/00*     (2006.01)
    *G11C 16/04*     (2006.01)
    *G11C 16/34*     (2006.01)

(52) U.S. Cl.
    CPC .......... *H01L45/1266* (2013.01); *H01L 45/141* (2013.01); *H01L 45/142* (2013.01); *H01L 45/143* (2013.01); *H01L 45/144* (2013.01); *H01L 45/146* (2013.01)

(56) References Cited

OTHER PUBLICATIONS

Rainer, Waser, et al., "Redox-Based Resistive Switching Memories—Nanoionic Mechanisms, Prospects, and Challenges", Advanced Materials, 2009, vol. 21, pp. 2632-2663.

\* cited by examiner

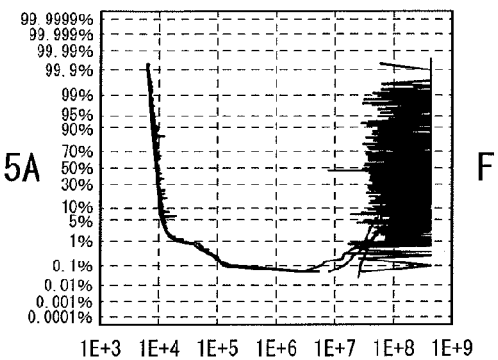
FIG. 5A EXPERIMENTAL SAMPLE 1
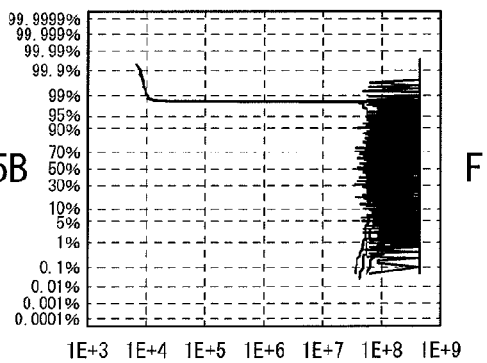
FIG. 5B EXPERIMENTAL SAMPLE 2
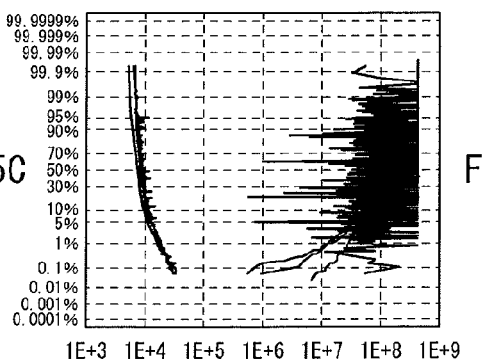
FIG. 5C EXPERIMENTAL SAMPLE 3
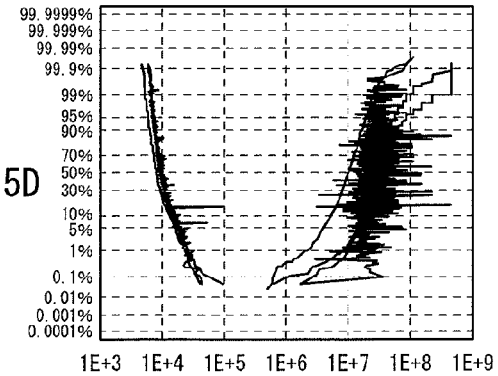
FIG. 5D EXPERIMENTAL SAMPLE 4
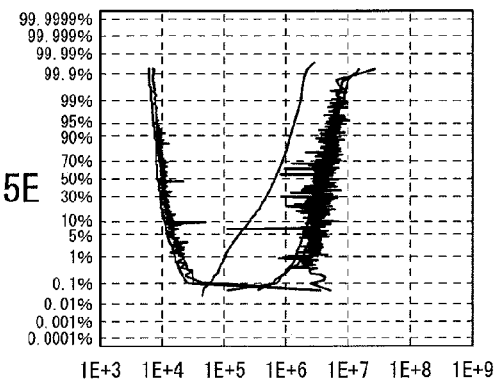
FIG. 5E EXPERIMENTAL SAMPLE 5
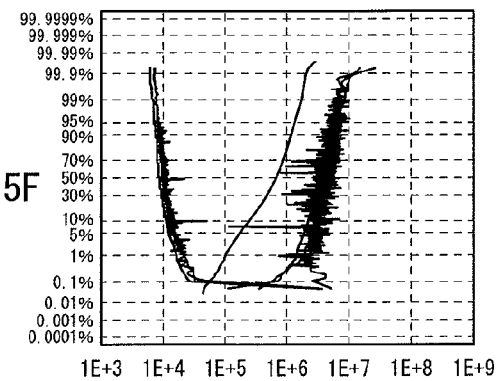
FIG. 5F EXPERIMENTAL SAMPLE 6

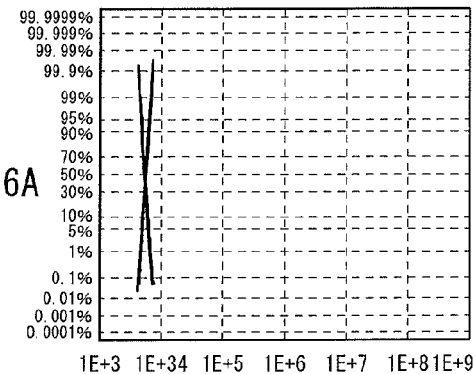
FIG. 6A EXPERIMENTAL SAMPLE 7
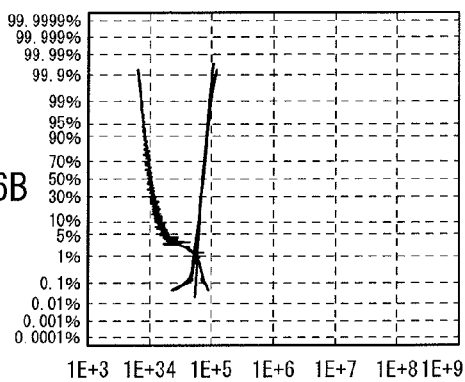
FIG. 6B EXPERIMENTAL SAMPLE 8
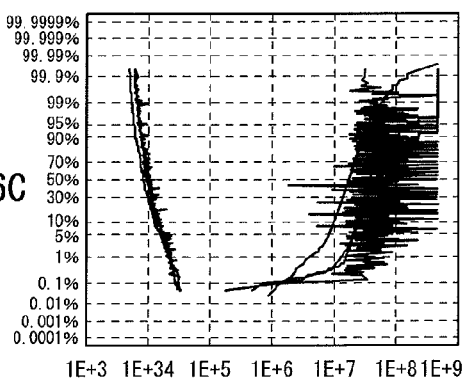
FIG. 6C EXPERIMENTAL SAMPLE 9
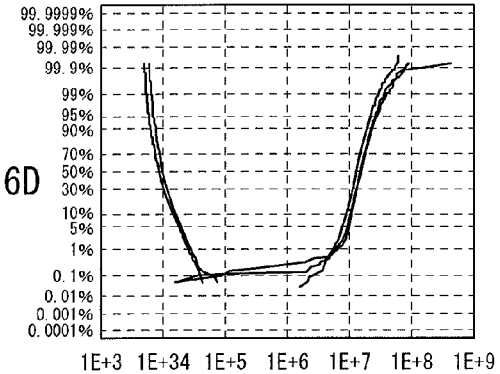
FIG. 6D EXPERIMENTAL SAMPLE 10
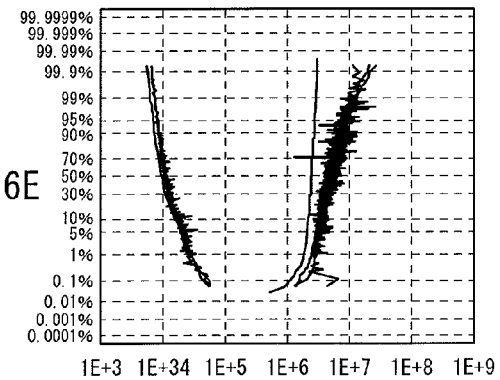
FIG. 6E EXPERIMENTAL SAMPLE 11
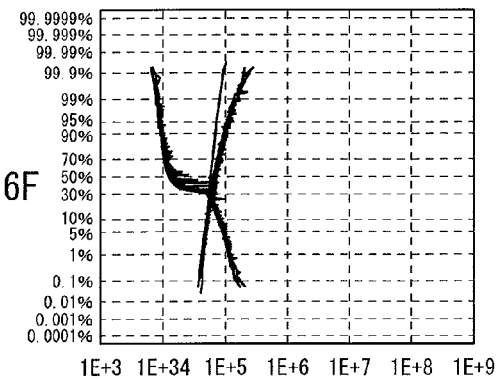
FIG. 6F EXPERIMENTAL SAMPLE 12

MEMORY ELEMENT AND MEMORY DEVICE

RELATED APPLICATION DATA

This application is a continuation of U.S. patent application Ser. No. 13/416,502 filed Mar. 9, 2012, the entirety of which is incorporated herein by reference to the extent permitted by law. The present application claims the benefit of priority to Japanese Patent Application No. JP 2011-061628 filed on Mar. 18, 2011 in the Japan Patent Office, the entirety of which is incorporated by reference herein to the extent permitted by law.

BACKGROUND

The present disclosure relates to a memory element and a memory device storing information based on any change of electrical characteristics observed in a memory layer including an ion source layer and a resistance change layer.

SUMMARY

A semiconductor nonvolatile memory popularly used for data storage has been a NOR or NAND flash memory. As for such a semiconductor nonvolatile memory, many attempts have been made to increase the capacity thereof by the microfabrication of memory elements and drive transistors therein. However, the semiconductor nonvolatile memory has been pointed out that there are limitations on microfabrication considering the need for a high level of voltage for writing and erasing, and the limited number of electrons injected into a floating gate.

For overcoming such limitations on the microfabrication, a next-generation nonvolatile memory currently proposed is a resistance change memory such as ReRAM (Resistance Random Access Memory) or PRAM (Phase-Change Random Access Memory) (for example, see Japanese Unexamined Patent Application Publication No. 2006-196537, and Waser et. al., Advanced Material, 21, p2932 (2009)). These memories are each in the simple configuration including a resistance change layer between two electrodes. In the memory of Japanese Unexamined Patent Application Publication No. 2006-196537, as an alternative to the resistance change layer, an ion source layer and an oxide film (thin film for storage) are provided between first and second electrodes. These resistance change memories are each formed therein with a conductive path through migration of atoms or ions by heat or an electric field, whereby a resistance value is supposed to change.

However, if a nonvolatile memory is microfabricated as such, the transistors driving the memory elements show a tendency to be decreased in drive current. However, the memory elements show a tendency to be increased in resistance as a result of the reduction of the area taken up thereby. As such, microfabricating the nonvolatile memory decreases the drive current of the transistors but the smaller memory elements cause the increase of writing current and voltage. This results in a failure of sufficient writing and erasing, thereby causing a disadvantage of reducing the element characteristics.

It is thus desirable to provide a memory element and a memory device with improved writing and erasing characteristics during operations at a low voltage and a low current.

A memory element according to an embodiment of the present disclosure includes a first electrode, a memory layer, and a second electrode in this order. The memory layer includes a resistance change layer provided on the first electrode side, an ion source layer provided on the second electrode side, an intermediate layer provided between the resistance change layer and the ion source layer, and a barrier layer provided at least either between the ion source layer and the intermediate layer, or between the intermediate layer and the resistance change layer, and the barrier layer containing a transition metal or a nitride thereof.

A memory device according to another embodiment of the present disclosure includes a plurality of memory elements, and a pulse application section. The memory elements each include a first electrode, a memory layer, and a second electrode in this order, and the pulse application section applies a voltage or current pulse selectively to the memory elements. In the memory device, the memory elements are each the memory element according to the embodiment of the present disclosure.

With the memory element (memory device) according to the embodiments of the present disclosure, after the memory layer is formed, movable ions (metal ions) in the ion source layer diffuse into the intermediate layer, and then move onto the first electrode for oxidation. The oxidized metal ions form an oxide film, i.e., a resistance change layer, so that the resulting memory element is put in the initial state with a high resistance, i.e., in the high-resistance state. When voltage or current pulses of "positive direction" (e.g., the first electrode side is at a negative potential, and the second electrode side is at a positive potential) are applied with respect to the element in the initial state (high-resistance state) as such, the first electrode serves as a cathode electrode, and the metal ions contained in the ion source layer or in the intermediate layer are moved to the resistance change layer. The metal ions then become almost in the form of metal by bonding with electrons in the resistance change layer on the first electrode as a result of a reduction reaction thereon. Alternatively, the oxide film itself forming the resistance change layer is reduced and resulted in a defect, thereby forming an impurity level. As a result, a low-resistance section (conductive path) containing the metallic element is formed in the memory layer, thereby decreasing the resistance of the resistance change layer (state of recording). When current pulses of "negative direction" (e.g., the first electrode side is at a positive potential, and the second electrode side is at a negative potential) are applied with respect to the element in the low-resistance state as such, the first electrode serves an anode electrode. This thus causes an oxidation reaction, and the conductive path made of the metallic element in the form of metal is ionized, and then is dissolved into the ion source layer. Or an oxide film is formed by the active metallic element bonding with oxygen therearound between the intermediate layer and the first electrode so that the resistance change layer is increased in resistance (initial state or state of erasing).

Herein, by providing the barrier layer containing a transition metal or a nitride thereof at least either between the ion source layer and the intermediate layer or between the intermediate layer and the resistance change layer, any excessive movement of the metal ions is to be favorably prevented.

According to the memory element and the memory device in the embodiments of the present disclosure, the barrier layer containing a transition metal or a nitride thereof is provided at least either between the ion source layer and the intermediate layer or between the intermediate layer and the resistance change layer. This accordingly prevents movable ions from excessively moving after the formation of the memory layer or during voltage application, thereby preventing any excessive increase of a resistance value. In other words, the writing and erasing characteristics are favorably improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 5A to 5F are diagrams of resistance distribution in the respective experimental samples.

FIGS. 6A to 6F are also diagrams of resistance distribution in the respective experimental samples.

DETAILED DESCRIPTION OF THE PREFERRED EMBODIMENT

In the below, by referring to the accompanying drawings, an embodiment of the present disclosure is described in the following order.
(Embodiment)
1. Memory Element (Memory Element with Barrier Layer disposed between Ion Source Layer and Intermediate Layer)
2. Memory Device
(Modification)
(Memory Element with Barrier Layer disposed between Intermediate Layer and Resistance Change Layer)

EXAMPLES (Embodiment)
(Memory Element)

Figure 1:
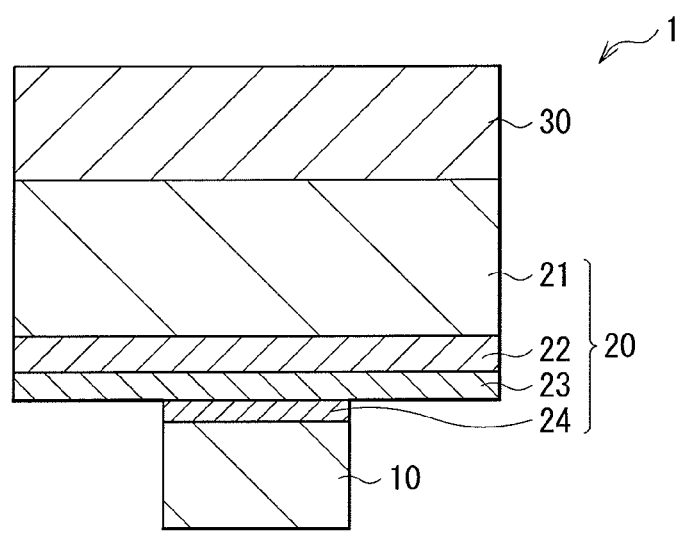
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing at least one of chromium (Cr), W, cobalt (Co), Si, gold (Au), palladium (Pd), Mo, iridium (Ir), titanium (Ti), and others that are more resistant to ionization than Al, or an oxide or nitride film thereof.

The memory layer 20 in this embodiment includes the ion source layer 21, a barrier layer 22, an intermediate layer 23, and a resistance change layer 24, which are disposed one on the other in this order from the upper electrode 30 side. The ion source layer 21 contains elements for forming a conductive path in the resistance change layer 24, i.e., an element to be converted into cations, and an element that is possibly anionized. Note that the movable ions (metal ions) described above are cations in this example. The element that is possibly cationized includes one or two or more of metallic elements such as Cu, Al, silver (Ag), and zinc (Zn). An ion conductive material that is to be anionized includes at least one or more of chalcogen elements including tellurium (Te), sulfur (S), and selenium (Se), or may include oxygen (O). The ion source layer 21 in this example is disposed to be in contact with the upper electrode 30. The metallic element(s) and the chalcogen element(s) are bonded together, thereby forming a metal chalcogenide layer. This metal chalcogenide layer is mainly in the amorphous structure, and serves as an ion supply source.

The metallic element that is possibly cationized moves in the ion source layer 21 or in the intermediate layer 23 during the operation of writing, and is reduced on the cathode electrode, thereby forming a conductive path (filament) in or almost in the form of metal. As such, considering to be movable in the ion source layer 21 or in the intermediate layer 23, the metallic element is preferably Cu, Al, Ag, Zr, and others described above. Considering to be chemically stable to remain in the form of metal in the ion source layer 21 containing the chalcogen element(s) described above, the metallic element may be transition metals of groups 3 to 11 in the periodic table other than those described above, for example. Among these elements, one or two or more are possibly used. Alternatively, silver (Ag) and Si or others may be used as additive elements to the ion source layer 21. Among the transition metals described above, for stabilization of the conductive path and for adjustment of resistivity of the ion source layer 21 described above, any of the following may be specifically used preferably, i.e., zirconium (Zr), hafnium (Hf), titanium (Ti), Mo, W, niobium (Nb), and Ta, and platinum (Pt), Cr, manganese (Mn), and iron (Fe) may be also used.

The specific material of the ion source layer 21 as such contains ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the metallic element configuring the ion source layer 21, any similar additive element is possibly used even if a transition metal element selected for use is not Zr but Mo, Mn, or Hf, e.g., possibly CuMoTeAl, and CuMnTeAl. Moreover, as for the ion conductive material, Te is surely not restrictive, and S, Se, or iodine (I) may be also used, i.e., specifically ZrSAl, ZrSeAl, ZrIAl, CuGeTeAl, and others, and Ta, W, or others may be added.

Note that the ion source layer 21 may be added with any other elements for the purpose of preventing peeling of film during a high-temperature heat treatment for the memory layer 20, for example. Si, Ge, or others are each an exemplary additive element that possibly offers also the improvement of retention characteristics, and is preferably added to the ion source layer 21 together with Zr.

The barrier layer 22 is disposed between the ion source layer 21 and the intermediate layer 23. This barrier layer 22 serves to control the movement of movable ions (metal ions) from the ion source layer 21 to the lower electrode 10 side. Specifically, the barrier layer 22 serves to prevent any excessive movement of the movable ions from the ion source layer 21 to the intermediate layer 23, and to prevent any formation of an oxide film on the surface of the lower electrode 10. With the barrier layer 22 formed as such, the memory element 1 is prevented from increasing in resistance value. The barrier layer 22 preferably has the film thickness thicker than 0.1 nm but thinner than 1 nm, for example. If the barrier layer 22 is not thick enough, the movable ions are not sufficiently prevented from moving. As a result, a high-resistant oxide film is formed on the lower electrode 10, and this increases the resistance value of the memory element 1. On the other hand, if the barrier layer 22 is too thick, the resistance value of the memory element 1 is decreased, and this resultantly narrows the resistance separation width during the operation of writing and erasing, thereby impairing the data retention characteristics. The material for such a barrier layer 22 includes at least a transition metal or a nitride thereof. The material specifically includes Cu, Ti, Zr, Hf, vanadium (V), niobium (Nb), Ta, Cr, Mo, and W.

The intermediate layer 23 is an electrolyte layer of effectively ionizing the metallic element that is to be converted into movable ions, and facilitating the movement of the movable ions. The intermediate layer 23 contains an ion conductive material that is to be anionized. The intermediate layer 23 is lower in conductivity than the ion source layer 21, and is more ready for application of voltage bias than the ion source layer 21 so that the movable ions are easy to move therein. As such, by the film thickness of the intermediate layer 23, the memory elements 1 are to be adjusted in resistance value. To be specific, the intermediate layer 23 preferably has the film thickness of 4 nm or more but 10 nm or less, for example. When the intermediate layer 23 is not thick enough, this diminishes the effect of facilitating the movement of the movable ions from the ion source layer 21 to the resistance change layer 24. On the other hand, when the intermediate layer 23 is too thick, this enhances the effect of facilitating the movement of the movable ions from the ion source layer 21 to the resistance change layer 24. As a result, the resistance value is increased too much, thereby possibly resulting in a difficulty in writing and erasing.

The intermediate layer 23 is made of a compound mainly containing Te that behaves as an anionic component, and Al that behaves as a movable cationic component. Such a compound is exemplified by AlTe. As for the movable cationic component, not only Al but Cu, Zn, and Ag may be used, and as a compound containing such a component, CuTe, ZnTe, and AgTe may be used. Another option is MgTe containing Mg. In the composition of the compound containing Te as such, e.g., AlTe, the content of Al is preferably 20 atomic % or higher but 60 atomic % or lower. As an anionic component, a chalcogen element such as sulfur (S) or selenium (Se) may be included together with Te.

The ratio of the content of aluminum (concentration of aluminum) to the content of the chalcogen element(s) in the intermediate layer 23 is preferably smaller than the ratio of the content of aluminum (concentration of aluminum) to the content of the chalcogen element(s) in the ion supply layer 21. As for aluminum (Al) in the intermediate layer 23, it is supposed to be produced by diffusion as a result of the concentration gradient with the ion source layer 21, and thus is expected to be smaller in content than the stoichiometric composition of $Al_2Te_3$. Such aluminum (Al) in the intermediate layer 23 is supposed to exist mostly in the form of ions. Moreover, as described above, the intermediate layer 23 is lower in conductivity but higher in resistance value than the ion source layer 21. Accordingly, applied potential is effectively used for driving ions so that the resulting nonvolatile memory is possibly with improved retention characteristics described above, and is operatable at a low current.

The resistance change layer 24 is disposed on the lower electrode 10 side, and in this example, is in contact with the lower electrode 10. This resistance change layer 24 shows a change of resistance value when a predetermined level of voltage is applied between the lower and upper electrodes 10 and 30. In this embodiment, this resistance change layer 24 is in the layered structure including a semiconductor or insulator and an oxide of movable cations, or is in the mixed structure thereof. The semiconductor or insulator is the one to be stable even if it is in contact with the intermediate layer 23. The resistance change layer 24 is exemplarily made of oxide materials, oxynitride materials, or nitride materials including at least one transition metal element including Ti, Zr, Hf, Ta, W, and others, for example. Such materials are preferable as are being stable against the cathode reaction even if the resistance change layer 24 is in contact with the intermediate layer 23. Moreover, an oxide of Al is preferable considering that it shows a high resistance value, and leads to a high resistance change ratio. The intermediate layer 23 may contain an oxide of Cu, Zn, and Ag that may be in the form of CuTe, ZnTe, and AgTe. Alternatively, when the intermediate layer 23 contains MgTe, an oxide of Mg may be contained.

Herein, at the point in time when the memory layer 20 is formed, in the resistance change layer 24, $TiO_2$ being a semiconductor layer that is stable even if it is in contact with the intermediate layer 23 is formed on the lower electrode 10, for example. However, after the formation of the memory layer 20, the movable ions in the ion source layer 21 or in the intermediate layer 23, e.g., aluminum ions, start diffusing gradually from the ion source layer 21 to the lower electrode side via the intermediate layer 23. As a result, in the resistance change layer 24, an oxide of Al is formed on $TiO_2$, or $TiO_2$ is mixed together with the oxide of Al. In other words, the resistance change layer 24 is in the layered or mixed structure including an Al oxide film contributing to oxidation-reduction, and a layer including a semiconductor or insulator preventing any unnecessary oxidation-reduction such as $TiO_2$. The resistance change layer 24 may be added with, other than the elements described above, a high-resistance oxide material such as Si or rare-earth oxide that increases more the resistance of the resistance change layer 24.

The upper electrode 30 may be made of a material similar to that of the lower electrode 10, i.e., a well-known material for use of semiconductor wiring, and preferably, be made of a stable material not reacting with the ion source layer 21 even after a post annealing treatment.

With such a memory element 1 of the embodiment, when a voltage or current pulse is applied by a power supply circuit (pulse application section; not shown) via the lower and upper electrodes 10 and 30, the memory layer 20 shows a change of the electrical characteristics thereof, e.g., change of the resistance value thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and then is diffused to the resistance change layer 24. By the cathode reaction on the lower electrode 10 side, the metallic element is then deposited by reduction in the resistance change layer 24 to be in the form of metal through bonding with electrons. As a result, a filament made of the low-resistance metallic element is formed. Alternatively, by the cathode reaction on the lower electrode 10 side, the high-resistance oxide film in the resistance change layer 24 is reduced and resulted in a defect, thereby forming an impurity level. As a result, a conductive path is formed in the resistance change layer 24, and this accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage thereto, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is expected. During the process of erasing, a negative voltage is applied to the memory element 1 such that the upper electrode 30 is at a negative potential, and the lower electrode 10 side is at a positive potential, for example. In response thereto, the metallic element configuring the filament formed inside of the resistance change layer 24 is ionized by the anode reaction, and then is dissolved into the intermediate layer 23 or into the ion source layer 21. In other words, the filament disappears or is decreased in area. Alternatively, the cyclized layer in the resistance change layer 24 at the impurity level is oxidized by the anode reaction so that any defect in the oxide layer is repaired. Specifically, the impurity level disappears, and the resistance value of the resistance change layer 24 shows an increase.

Thereafter, even if the memory element 1 becomes free of voltage by stopping the application of the negative voltage thereto, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 24 causes a difficulty in writing, i.e., in decreasing the resistance. As a result, since a threshold voltage for writing is increased too much, the initial resistance value is adjusted to be 1 G$\Omega$ or smaller. The resistance value of the resistance change layer 24 is possibly controlled by the thickness thereof or the content of anions therein, for example.

In the embodiment, as described above, the ion source layer 21 preferably contains Zr, Al, Ge, and others. The reasons are described below.

When the ion source layer 21 contains Zr, Al, and Cu together with a chalcogen element that is possibly anionized, the ion source layer 21 possibly remains in the mechanical structure even if the movable cations such as Cu and Al described above are diffused into the intermediate layer 23 so that the matrix structure is possibly kept stably. What is more, since a fixed percentage of Zr remains in the form of metal without being ionized, the ion source layer 21 possibly remains high in conductivity. Zr acts as movable ions although the mobility thereof is low, and forms a conductive path in which Zr is mixed with a metallic element such as Cu and Al being high in ion mobility. The conductive path made of Zr reduced on the cathode electrode during the operation of writing is chemically stable because it is less likely to oxidize and dissolve even if being in contact with the intermediate layer 23 containing a high percentage of a chalcogen element that is to be anionized. On the other hand, Cu and Al are easy to ionize in the intermediate layer 23 containing a high percentage of a chalcogen element. However, as is easy to ionize as such, Cu and Al almost in the form of metal are likely to be less chemically stable and get easy to oxidize if it comes in contact with the intermediate layer 23. Accordingly, in the state of no application of a writing voltage pulse, i.e., in the data retention state, Cu and Al are ionized again so that the state transition occurs to be high in resistance. As such, the state of low resistance is easy to retain not only with a conductive path containing highly movable ions described above such as Cu and Al but also with an ion source layer containing Zr. Moreover, combining Zr with an appropriate amount of Cu facilitates amorphization, and keeps uniform the microstructure of the ion source layer 21, thereby contributing to the improvement of resistance value retention characteristics.

As for the retention of the high-resistance state during the erasing operation, exemplified now is a case where the ion source layer 21 contains Al. When the intermediate layer 23 has a low concentration of Al immediately after the memory layer 20 is formed, or when the upper electrode 30 is biased to a negative potential as a result of the erasing operation, Al contained in the ion source layer 21 is ionized, and then moves to the resistance change layer 24 via the intermediate layer 23, thereby forming an oxide of Al. The oxide of Al is chemically stable even if it is in contact with the intermediate layer 23 containing a high percentage of a chalcogen element, and thus remains high in resistance even if it is left as it is for a long time. Accordingly, any unwanted reduction reaction is less likely to occur, and under the storage in the temperature higher than the room temperature or under the storage for a long time, the high-resistance state is kept as it is. This also contributes to the increase of the repetition frequency considering the self-reproduction of the resistance change layer. Herein, Ge or others may be also used for the purpose of stabilizing the matrix structure of the ion source layer 21, or of preventing film peeling.

As such, when the ion source layer 21 contains Zr, Al, Cu, Ge, and others, compared with the previous memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also by controlling the state of oxidization for the resistance change layer 24 by changing a write current during a change of resistance from high to low.

Moreover, other than Zr, using the transition metal elements described above, especially Hf, Mo, W, Nb, Ta, Pt, Cr, Mn, and Fe, favorably stabilizes the microstructure of the ion source layer 21, thereby leading to better retention of a filament, i.e., improving the low-resistance state retention characteristics of the resistance change layer 24.

In the below, the manufacturing method of the memory element 1 in the embodiment is described.

First of all, on a substrate formed with a CMOS circuit such as selection transistor, the lower electrode 10 made of TiN is formed, for example. Thereafter, if appropriate, any oxides or others on the surface of the lower electrode 10 are removed by reverse sputtering, for example. Next, the formation of layers is performed up to the upper electrode 30 including the resistance change layer 24, the intermediate layer 23, the barrier layer 22, and the ion source layer 21 in succession through exchange of targets in a device for sputtering. The targets herein are those each with the composition adapted for the material of the corresponding layer. The diameter of the electrode is 50 to 300 nmφ. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post annealing treatment. As such, the memory element 1 of FIG. 1 is completed.

In this memory element 1, as described above, a voltage is so applied that the upper electrode 30 is at a positive potential and the lower electrode 10 is at a negative potential, thereby forming a conductive path in the resistance change layer 24. This accordingly decreases the resistance value of the resistance change layer 24 so that writing is performed. Next, to each of the upper and lower electrodes 30 and 10, applied this time is a voltage whose polarity is opposite to that applied thereto for writing. In response thereto, the metallic element in the conductive path formed inside of the resistance change layer 24 is ionized again, and then is dissolved into the intermediate layer 22 or the ion source layer 21. This accordingly increases the resistance value of the resistance change layer 24, or makes disappear the impurity level as a result of the defect in the oxide film in the resistance change layer 24 so that the resistance value is increased and the operation of erasing is performed.

As a result of the capacity increase of the resistance change memory, i.e., as a result of the microfabrication of the memory element 1, the drive transistor is decreased in current value. Therefore, for increasing the capacity of the resistance change memory, preventing the increase of the operation current value of the memory element 1 is important. To be specific, the operation current value is expected to be 100 μA or smaller considering the decreased current of the drive transistor as a result of the microfabrication and the strength of diodes.

The current value at the time of changing the state of the resistance change memory to low resistance (to the state of writing) is possibly controlled by changing the drive current value of the transistor. In other words, by reducing the drive current value of the transistor, the current value that puts the resistance change memory to the low-resistance state may be prevented from increasing. However, the conductive path to be formed during writing of data is in the state of inadequate reduction, i.e., is not reduced to be in the form of metal, and thus is likely to be oxidized again and increased in resistance. Moreover, the conductive path is not stable as is narrower in width compared with a metal filament to be formed during writing of data with a high current value.

Moreover, for preventing the current value from increasing when the resistance change memory is changed in state to high resistance (to the state of erasing), similarly to the case of writing of data, the transistor may be decreased in drive current value. Note here that if the transistor is low in drive voltage, this makes obvious the influence of reducing the heat generation in the resistance change memory, and of dividing the voltage to unnecessary portions of the transistor or of the resistance change memory, whereby the operation margin abruptly drops.

The previous memory element is in the configuration of "lower electrode/lower electrode oxide film (resistance change layer)/intermediate layer/ion source layer/upper electrode", for example. In such a memory element, movable ions coming from the ion source layer, e.g., Al ions, move to the surface of the lower electrode via an intermediate layer where ion conduction occurs with more ease than the ion source layer. Immediately after the memory layer is formed, the movable ions having reached the surface of the lower electrode are oxidized so that an oxide film high in resistance is formed. In the resistance change layer being in contact with the surface of the lower electrode, due to the oxidation-reduction reaction of the movable ions or the oxidation-reduction reaction of the oxide film of the movable ions, a conductive path is formed, and at the same time, the oxide film is decreased in area so that the resistance change layer shows a change of resistance value. In the intermediate layer, the composition ratio is high between the anionizing element, e.g., Te, and an ionizing element, e.g., Al. As such, with the intermediate layer provided, the movable ions are to move with more ease, but on the other hand, the excessive movement of the movable ions causes the excessive formation of Al oxides, thereby resulting in a tendency of increasing the element resistance together with the resistance value of the intermediate layer itself.

For increasing the capacity of the memory, microfabricating the memory elements and the drive transistors configuring the memory is expected as described above. However, if the transistors are microfabricated as above, the drive current shows a decrease. In consideration thereof, for increasing the capacity of the memory, expected are memory elements operatable at a low current.

With the memory element configured as above, decreasing the element resistance allows the operation at a low current. For decreasing the element resistance, the intermediate layer may be made thinner. However, if the intermediate layer where movable ions are easy to move is made thinner as such, the effect to be produced by the resulting intermediate layer, i.e., the effect of allowing the movable ions to move with more ease is diminished. This causes a difficulty in switching at a low current, e.g., a change of resistance value from the high-resistance state to the low-resistance state, thereby impairing the element characteristics for writing and erasing, for example. As such, the intermediate layer is expected to be made thicker to decrease the resistance value. The issue here is that, however, when the intermediate layer is made thicker as described above, an oxide film is formed easily because the movable ions move onto the lower electrode, and thus the element resistance is disadvantageously increased.

On the other hand, with the memory element 1 of this embodiment, the ion source layer 21 and the intermediate layer 23 are provided therebetween with the barrier layer 22 containing a transition metal or a nitride thereof. Such a structure favorably prevents the movement of movable ions (e.g., Al ions) to be provided excessively from the ion source layer 21. This accordingly prevents the formation of a metallic oxide film, e.g., AlOx, on the surface of the lower electrode 10.

As described above, with the memory element 1 of the embodiment, the ion source layer 21 and the intermediate layer 23 are provided therebetween with the barrier layer 22 containing a transition metal or a nitride thereof. Such a structure favorably prevents the movement of movable ions (e.g., Al ions) to be provided excessively from the ion source layer 21. This accordingly prevents the formation of a metallic oxide film, e.g., AlOx, on the surface of the lower electrode 10. In other words, this allows the intermediate layer 23 to remain thick, and prevents any possible increase of the element resistance. As such, the characteristics of data writing and erasing to/from the memory element 1 are improved with the memory element 1 remained low in resistance value.
(Memory Device)

By arranging a plurality of memory elements 1 described above in rows or in a matrix, for example, a memory device (memory) is possibly configured. At this time, as appropriate, the memory elements 1 may be each connected, with a MOS transistor for element selection use or with a diode to configure a memory cell. The resulting memory cells may be then each connected to a sense amplifier, an address decoder, circuits of writing, erasing, and reading, and others by wiring.

Figure 2:
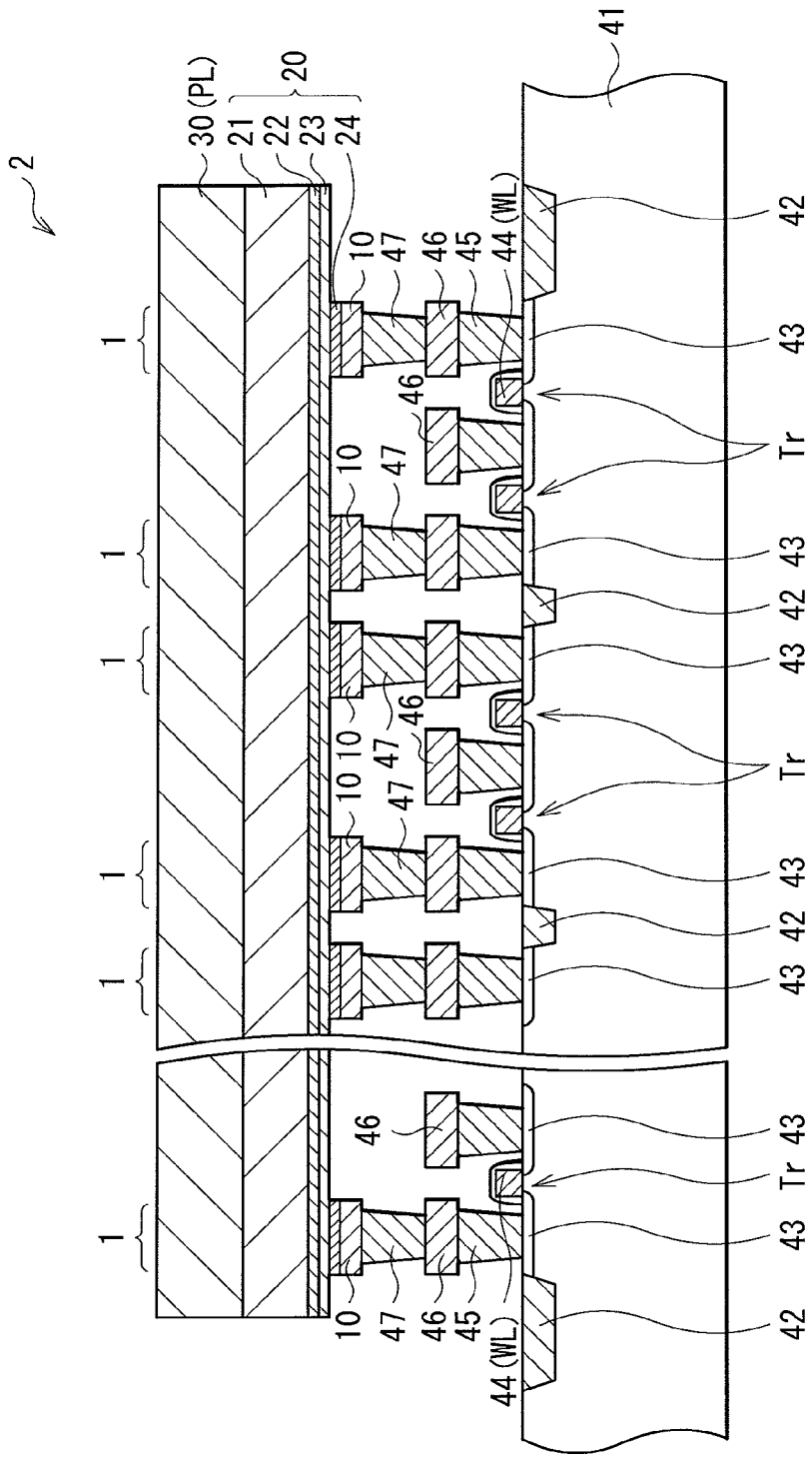
FIG. 2 is a cross-sectional view of a memory cell array using the memory element of FIG. 1, showing the configuration thereof.
Figure 3:
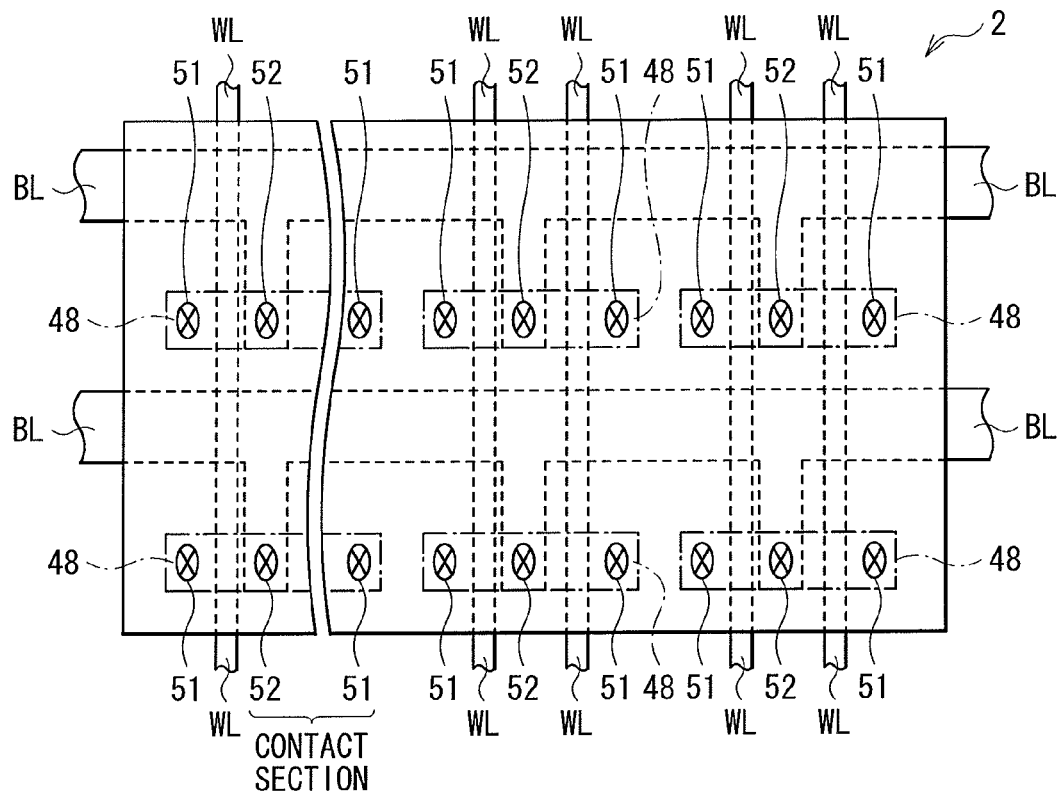
FIG. 3 is a plan view of the memory cell array of FIG. 2.

FIGS. 2 and 3 each show an exemplary memory device (memory cell array) including a large number of memory elements 1 arranged in a matrix. FIG. 2 shows the cross-sectional configuration of the memory cell array, and FIG. 3 shows the configuration thereof in a planar view. In this memory cell array, to each of the memory elements 1, wiring connected to the lower electrode 10 side thereof is so provided as to intersect wiring connected to the upper electrode 30 side thereof, and at the respective intersection points, the memory element 1 is disposed.

The memory elements 1 all share the layers, i.e., the resistance change layer 24, the ion source layer 21, and the upper electrode 30. In other words, these layers, i.e., the resistance change layer 24, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position to correspond to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A sidewall insulation layer is formed on the wall surface of the gate electrode 44. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and contact sections 52 are each connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.
(Modification)

Figure 4:
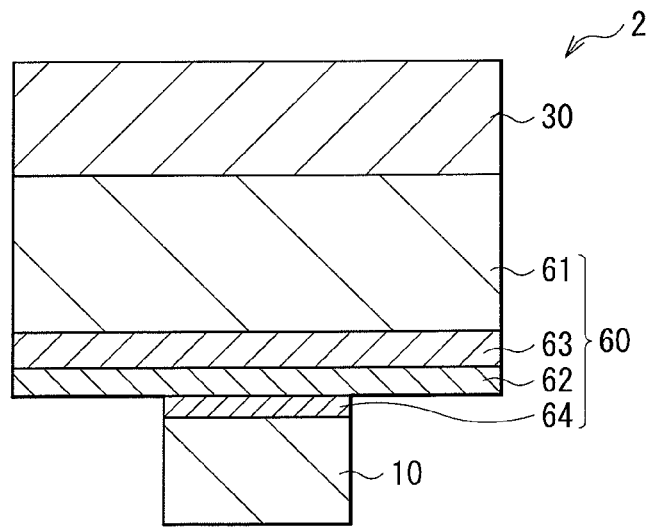
FIG. 4 is a cross-sectional view of a memory element in a modification of the present disclosure, showing the configuration thereof.

FIG. 4 is a cross-sectional view of a memory element 2 in a modification of the present disclosure, showing the configuration thereof. Any configuration component similar to that of the embodiment described above is provided with the same reference numeral, and is not described again. The memory element 2 includes the lower electrode 10 (first electrode), a memory layer 60, and the upper electrode 30 (second electrode) in this order. The memory layer 60 is in the structure different from that in the embodiment, i.e., is in the layered structure including an ion source layer 61, an intermediate layer 63, a barrier layer 62, and a resistance change layer 64, which are disposed one on the other in this order from the upper electrode 30 side.

The ion source layer 61 is in the structure similar to that of the ion source layer 21 described above, i.e., includes at least one of transition metals in a group of Ti, Zr, Hf, V, Nb, Ta, Cr, Mo, and W together with Al, Cu, silver (Ag), zinc (Zn) that is to be cationized, and a chalcogen element that is to be anionized.

The intermediate layer 63 and the resistance change layer 64 are respectively in the structures similar to those of the intermediate layer 23 and the resistance change layer 24 described above. Specifically, the intermediate layer 63 is made of a cationic component and a movable anionic component, and in addition to AlTe, for example, CuTe, ZnTe, AgTe, or MgTe will also do. Moreover, as an alternative to Te, the anionic component therein may be a chalcogen element such as sulfur (S) or selenium (Se). The resistance change layer 64 is made of an oxide, oxinitride, or nitride containing at least one of the transition metal elements including Ti, Zr, Hf, Ta, W, and others, and an oxide of Al, Cu, Ag, and Zn being movable ions. Alternatively, the resistance change layer 64 may contain an oxide of high-resistance rare-earth elements including Ge, Mg, and Si.

The barrier layer 62 is for controlling the movement of the movable ions from the ion source layer 61 to the lower electrode side, and is disposed between the intermediate layer 63 and the resistance change layer 64. Such a barrier layer 62 is made of at least one transition metal or a nitride thereof similarly to the barrier layer 22 described above. To be specific, such a material is exemplified by Cu, Ti, Zr, Hf, V, Nb, Ta, Cr, Mo, and W. Moreover, the barrier layer 62 preferably has the film thickness thicker than 0.1 nm but thinner than 1 nm.

In the memory element 2 in this modification, with the barrier layer 62 disposed between the intermediate layer 63 and the resistance change layer 64, the effect similar to that achieved with the memory element 1 in the embodiment above is possibly achieved.

EXAMPLES

In the below, specific examples of the present disclosure are described.

The memory elements 1 and 2 of FIGS. 1 and 4 were respectively manufactured similarly to the memory elements in the embodiment described above. First of all, the lower electrode 10 made of TiN with a transistor incorporated in the base was subjected to cleaning and plasma oxidation by argon plasma. The memory layer 20 or 60, and the upper electrode 30 were formed on the resulting lower electrode 10 using a device for sputtering. The electrode diameter was 150 nmϕ. The layer made of alloy was formed at the same time using a target of the component element. Thereafter, the upper electrode 30 was subjected to etching on the surface, and therefore a wiring layer (Al layer) with the thickness of 200 nm is formed for a connection to the contact portion where an external circuit was connected for provision of an intermediate potential (Vdd/2). Thereafter, in a furnace for a vacuum heat treatment, the resulting structure was subjected to a heat treatment for two hours at the temperature of 340° C. as a post annealing treatment. In this manner, the memory cell arrays shown in FIGS. 2 and 3 were manufactured with various compositions and film thicknesses, and the results were used as Experimental Samples 1 to 12. Herein, the resistance change layers 24 and 64 formed by plasma oxidation each have the film thickness of about 1 nm after the analysis by XRR (X-Ray Reflectometer) or XPS (X-Ray Photoelectron Spectroscopy).

In these Experimental Samples 1 to 12, the upper wiring pattern connected to the upper electrode 30 was grounded at the intermediate potential of Vdd/2, and then a voltage was applied to the gate electrode of any selected memory cell, i.e., to the word line WL, so that the state was changed to ON. Thereafter, the "operation of writing" was performed to the memory cell array of 4 kbit, and then reading of the resistance value was performed. The "operation of writing" was an operation of applying a voltage of 3.0 V with a pulse width of 10 ns, and with a current for writing of about 100 μA to, in the source/drain 13 of the transistor Tr, the electrode connected to the one of those not connected to the memory element 1, i.e., to the bit line BL. Next, a voltage was applied to the gate electrode to change the state to ON, and then performed was the "operation of erasing", which was an operation of applying a voltage of 2.0 V with the pulse width of 10 ns, and with a current for erasing of about 100 μA. After such an operation of erasing, the resistance value in the state of erasing was read. Thereafter, by performing writing (low-resistance state) and erasing (high-resistance state) of the memory cell array by 2 kbit, the distribution of resistance in the respective states was checked also with the operation ratio for bits allowing writing to a resistance value of 10 kΩ or lower.

In Experimental Samples 1 to 12, the composition of each layer was as below. In Experimental Samples 1, and 4 to 7, the layers were stacked in order of "lower electrode/resistance change layer/intermediate layer/barrier layer/ion source layer/upper electrode", and in Experimental Samples 8 to 12, the layers were stacked in order of "lower electrode/resistance change layer/barrier layer/intermediate layer/ion source layer/upper electrode". Note that in Experimental Samples 2 and 3, no barrier layer was provided. In Experimental Samples 1 to 12, the resistance change layer (TiOx) had the film thickness of about 1 nm, and AlOx was self-generated with the thickness of 1 to 2 nm so that the resulting layer was the resistance change layer 24 or 64. The ion source layers 21 and 61 each had the film thickness of 60 nm, and the upper electrode (W) 30 had the film thickness of 50 nm. The film thickness of the barrier layers 22 and 62, and that of the intermediate layers 23 and 63 are shown in Table 1.

(Experimental Sample 1) TiN/TiOx/Te/Zr/CuZrTeAlGe/W
(Experimental Sample 2) TiN/TiOx/Te/CuZrTeAlGe/W
(Experimental Sample 3) TiN/TiOx/Te/CuZrTeAlGe/W
(Experimental Sample 4) TiN/TiOx/Te/Zr/CuZrTeAlGe/W
(Experimental Sample 5) TiN/TiOx/Te/Zr/CuZrTeAlGe/W
(Experimental Sample 6) TiN/TiOx/Te/Zr/CuZrTeAlGe/W
(Experimental Sample 7) TiN/TiOx/Te/Zr/CuZrTeAlGe/W
(Experimental Sample 8) TiN/TiOx/CuZr/Te/CuZrTeAlGe/W
(Experimental Sample 9) TiN/TiOx/CuZr/Te/CuZrTeAlGe/W
(Experimental Sample 10) TiN/TiOx/CuZr/Te/CuZrTeAlGe/W
(Experimental Sample 11) TiN/TiOx/CuZr/Te/CuZrTeAlGe/W
(Experimental Sample 12) TiN/TiOx/CuZr/Te/CuZrTeAlGe/W Table 1 is a list of writing availability ratio based on the film thickness of the barrier layers 22 and 62 and that of the intermediate layers 23 and 63 in Experimental Samples 1 to 12, the erasing resistance (median of the resistance values in the high-resistance state), and the cumulative frequency distribution. FIGS. 5A to 5F each show the resistance distribution (cumulative frequency distribution) after the repeated tests in Experimental Samples 1 to 12.

TABLE 1

|  | Intermediate Layer (nm) | Barrier Layer (nm) | Erasing Resistance (Ω) | Writing Availability Ratio (%) |
|---|---|---|---|---|
| Experimental Sample 1 | 10 | 0.5 | 430M | 99.9 |
| Experimental Sample 2 | 10 | — | 430M | 2 |
| Experimental Sample 3 | 5 | — | 87M | 99.95 |
| Experimental Sample 4 | 5 | 0.1 | 26M | 99.95 |
| Experimental Sample 5 | 5 | 0.3 | 8.2M | 99.95 |
| Experimental Sample 6 | 5 | 0.7 | 3.6M | 99.9 |
| Experimental Sample 7 | 5 | 1 | 8.7M | 99.95 |
| Experimental Sample 8 | 10 | 1 | 71k | 97.3 |
| Experimental Sample 9 | 5 | 0.1 | 48M | 99.95 |
| Experimental Sample 10 | 5 | 0.3 | 15M | 99.9 |
| Experimental Sample 11 | 5 | 0.5 | 4.5M | 99.95 |
| Experimental Sample 12 | 5 | 0.8 | 63k | 67.7 |

First of all, a comparison of writing availability ratio was made among Experimental Samples 1 to 3. In Experimental Sample 3 with the intermediate layer 23 having the film thickness of 5 nm, the writing availability ratio was 99.95% or higher. In contrast to this, in Experimental Sample 2 with the intermediate layer 23 having the film thickness of 10 nm, the writing availability ratio was only about 2%. This seems to be because, as is evident from FIG. 5B, the intermediate layer 23 increased in film thickness caused an increase of the element resistance, and the writing threshold voltage and current were thus increased, thereby resulting in a failure of writing. On the other hand, in Experimental Sample 1, the intermediate layer 23 had the film thickness of 10 nm similarly to that in Experimental Sample 3, but the writing availability ratio was 99.9%, and the operation characteristics were satisfactory. This seems to be because, by providing the Zr-made barrier layer 22 on the interface between the ion source layer 21 and the intermediate layer 23, any excessive diffusion of Al ions was prevented toward the lower electrode 10 side. This accordingly prevented the formation of a high-resistance film (AlOx) on the interface between the lower electrode 10 and the resistance change layer 24 so that the element resistance seems to be controlled not to be increased.

Figure 7A:
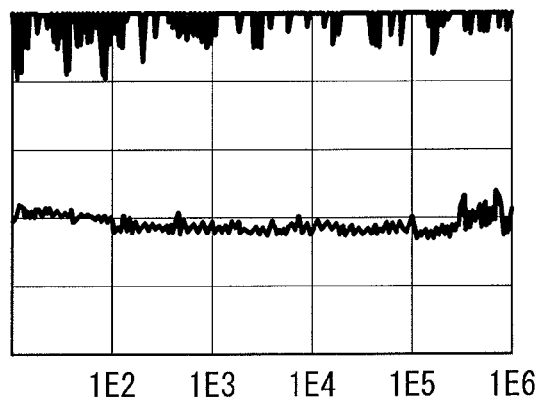
FIGS. 7A and 7B are diagrams showing the data retention characteristics in the respective experimental samples.
Figure 7B:
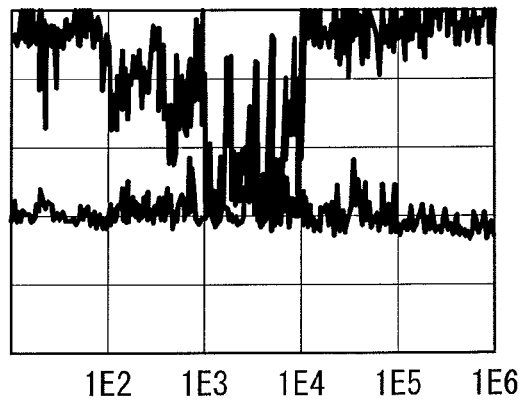

Next, a comparison of operation at a low current was made between Experimental Samples 1 and 3. FIGS. 7A and 7B show the result of a low-current repetition endurance test up to the repetition of $10^6$. The test was performed to Experimental Sample 1 (FIG. 7A) and Experimental Sample 3 (FIG. 7B) with the applied voltage during writing/erasing of 3.0 V/2.0 V, the pulse width during writing/erasing of 10 ns/10 ns, and the current of 50 μA. In Experimental Sample 1, the data retention characteristics remained satisfactory with the repetition of $10^6$ or more. On the other hand, in Experimental Sample 3, the data retention characteristics were lost with the repetition of about $10^2$. This seems to be due to the thickness of the intermediate layer 23. In Experimental Sample 1 in which the intermediate layer 23 was a layer made of Te with the thickness of 10 nm, a layer of AlTe was formed immediately after the formation of the ion source layer because Al ions were easily moved. A thicker AlTe layer brought a higher resistance, and by the AlTe layer, a high level of voltage bias was divided, thereby producing an effect of facilitating the movement of the Al ions. As such, the Al-made conductive path formed in the resistance change layer 24 during the operation of erasing was more likely to put back to the ion source layer 21. This is the reason why Experimental Sample 1 shows the better erasing characteristics than those in Experimental Sample 3.

With the barrier layer 22 provided as above, even if the intermediate layer 23 was increased in film thickness, any excessive diffusion of Al ions to the lower electrode 10 side was favorably prevented, and any overwriting of the element resistance was prevented without impairing the mobility of the Al ions. In other words, with the barrier layer 22 provided as such, the resulting memory element 1 was low in resistance, and at the same time, have the low-current operation characteristics.

Figure 8A:
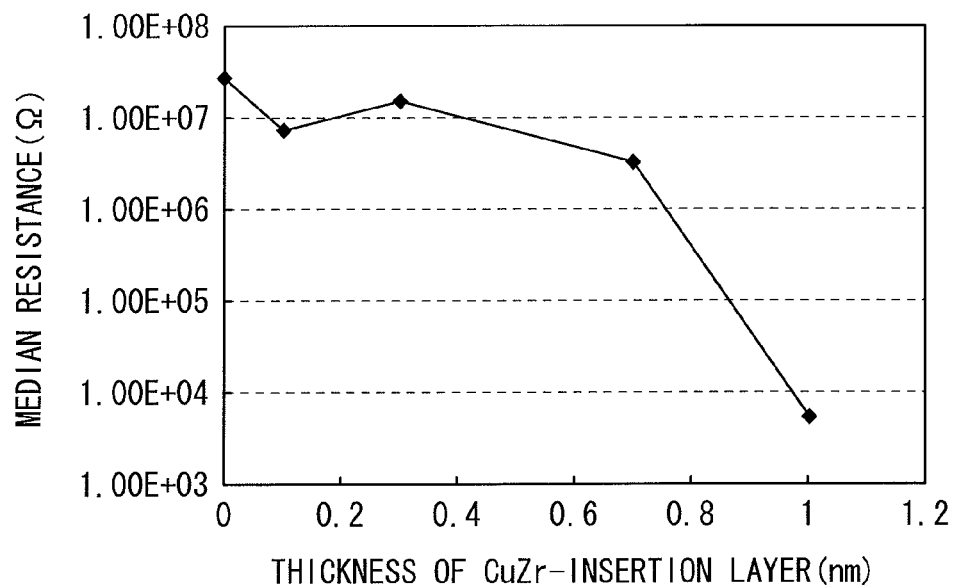
FIGS. 8A and 8B are each a characteristics diagram showing a relationship between the element resistance and the film thickness of a barrier layer.
Figure 8B:
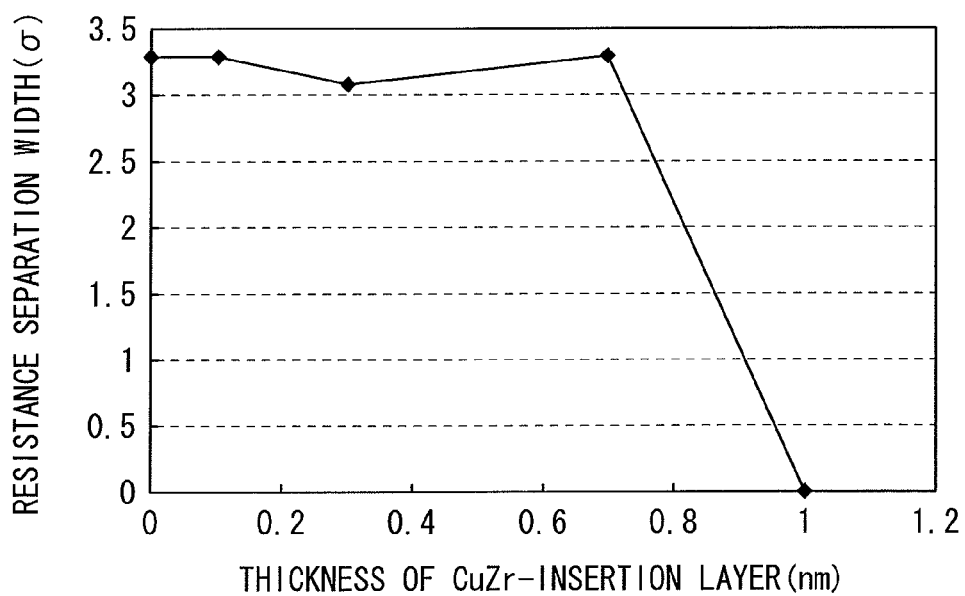

By referring to Experimental Samples 1, and 4 to 7, described next is the relationship between the film thickness of the barrier layer 22, the median resistance, and the resistance separation width. FIGS. 8A and 8B each show, based on the results of FIGS. 5A, 5D to 5F, and FIG. 6A, the relationship between the film thickness of the barrier layer 22 and the median resistance (FIG. 8A), and the relationship between the film thickness of the barrier layer 22 and the resistance separation width (FIG. 8B). As is known from FIG. 8A, the median resistance was reduced as the barrier layer 22 was increased in film thickness. In other words, the provision of the barrier layer 22 prevented the element resistance from increasing. However, as is known from FIG. 8B, if the barrier layer 22 had the film thickness being too thick, the resistance separation width was reduced, and the resistance separation characteristics were impaired. Since the intermediate layer 23 in Experimental Sample 1 was twice thicker than those in Experimental Samples 4 to 7, the element resistance was easily assumed to be high. As such, the film thickness of the barrier layer 22 was preferably thicker at least than 0.1 nm but thinner than 1 nm to allow the memory element 1 to be low in resistance, and at the same time, to have the low-current operation characteristics.

Figure 9A:
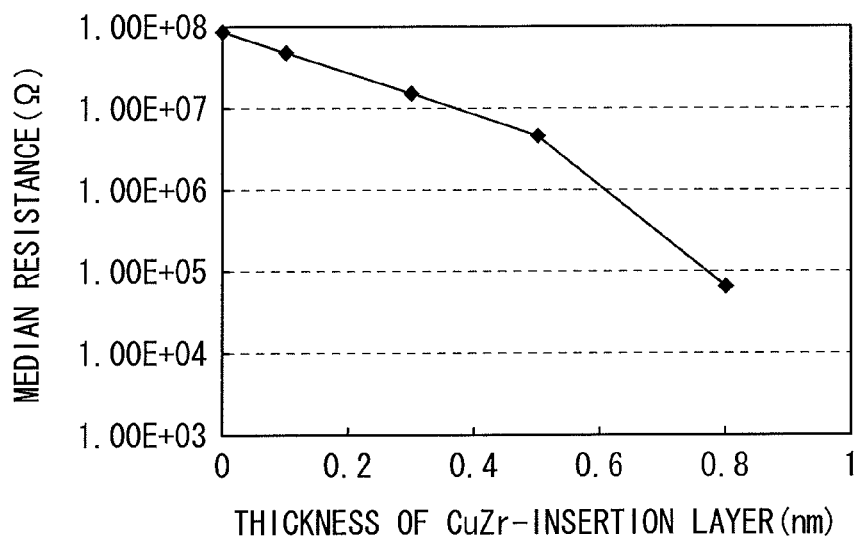
FIGS. 9A and 9B are each a characteristics diagram showing also the relationship between the element resistance and the film thickness of the barrier layer.
Figure 9B:
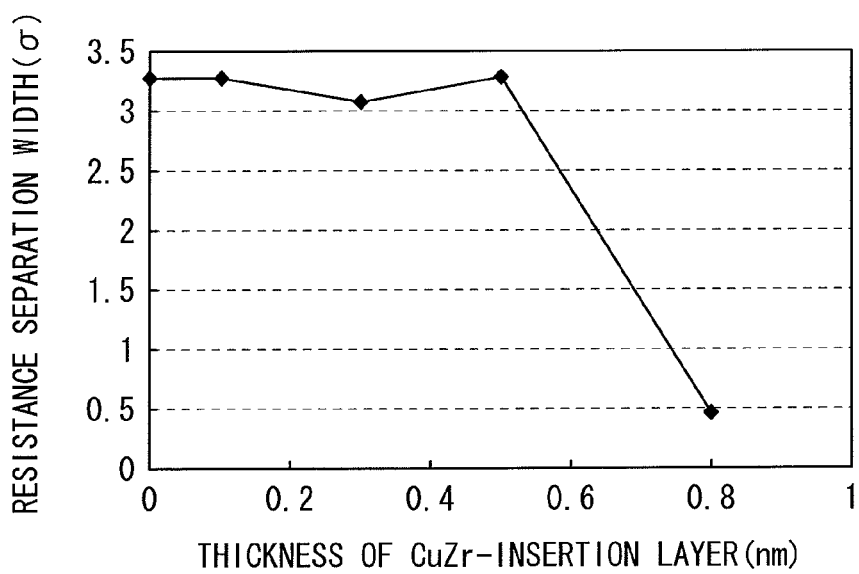

Described next is the relationship between the film thickness, the median resistance, and the resistance separation width in Experimental Samples 8 to 12 in which the barrier layer 62 is disposed between the intermediate layer 63 and the resistance change layer 64. FIGS. 9A and 9B each show, based on the results of FIGS. 6B to 6F, the relationship between the film thickness of the barrier layer 62 and the median resistance (FIG. 9A), and the relationship between the film thickness of the barrier layer 62 and the resistance separation width (FIG. 9B). As is known from FIG. 9A, the median resistance was reduced as the barrier layer 62 was increased in film thickness similarly to those in Experimental Samples 1, and 4 to 7 described above. To be specific, Experimental Samples 8 and 11 respectively show the resistance of 4.5 MΩ and 71 kΩ which were smaller compared with Experimental Sample 3 (87 MΩ) in which the barrier layer 64 was not provided. However, in Experimental Sample 12 in which the barrier layer had the thickness of 1 nm, since the element resistance was decreased too much, the writing availability ratio was decreased as shown in FIG. 6F. Specifically, although the writing availability ratio in Experimental Samples 8 to 11 was 99.9% or higher, Experimental Sample 12 shows the lower writing availability ratio, i.e., 67.7%. As such, similarly to Experimental Samples 1, and 4 to 7 described above, the film thickness of the barrier layer 62 was preferably thicker at least than 0.1 nm but thinner than 1 nm to allow the memory element 2 to be low in resistance, and at the same time, to have the low-current operation characteristics.

Furthermore, based on the results of FIGS. 8A and 8B, and those of FIGS. 9A and 9B, with the barrier layers 22 and 62 provided as such, irrespective of the position and material thereof, the memory elements 1 and 2 are known to be reduced in element resistance, and to have the better low-current operation characteristics.

While the present disclosure has been described in detail by referring to the embodiment, modification, and Examples, the present disclosure is not restrictive to the embodiment and others described above, and it is understood that numerous other modifications may be possibly devised.

For example, in the embodiment and modification above, the configurations of the memory elements 1, 2, and that of the memory cell array are specifically described. However, all of the layers are not necessarily provided, or any other layers may be also provided. To be specific, in the embodiment and modification above, exemplified is the case of providing a piece of the barrier layer 22 (62) between the ion source layer 21 and the intermediate layer 23 (between the intermediate layer 63 and the resistance change layer 64). Alternatively, the barrier layer 22 (62) may be provided respectively between the ion source layer and the intermediate layer, and between the intermediate layer and the resistance change layer.

Moreover, for example, the materials of the layers, the film-forming methods and conditions, and others described in the embodiment and others above are surely not restrictive, and any other materials, or any other film-forming methods will also do. For example, the ion source layers 21 and 61 may be each added with any other types of transition metal element such as Ti, Hf, V, Nb, Ta, Cr, Mo, or W as long as the composition ratio described above remains the same, and other than Cu, Ag, and Zn, nickel (Ni) may be added.

The present disclosure contains subject matter related to that disclosed in Japanese Priority Patent Application JP 2011-61628 filed in the Japan Patent Office on Mar. 18, 2011, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A memory element, comprising:
a first electrode, a memory layer, and a second electrode in this order,
wherein,
the memory layer includes
(a) a resistance change layer on the first electrode,
(b) an ion source layer,
(c) an intermediate layer between the resistance change layer and the ion source layer, and
(d) a barrier layer between the ion source layer and the intermediate layer or between the intermediate layer and the resistance change layer, the barrier layer having a surface in contact with the intermediate layer.

2. The memory element according to claim 1, wherein the barrier layer contains one or more of copper (Cu), titanium (Ti), zirconium (Zr), hafnium (Hf), vanadium (V), niobium (Nb), tantalum (Ta), chromium (Cr), molybdenum (Mo), or tungsten (W) as the at least one transition metal.

3. The memory element according to claim 1, wherein the barrier layer has a film thickness thicker than 0.1 nm but thinner than 1 nm.

4. The memory element according to claim 1, wherein the ion source layer contains at least one ionizing metallic element selected from the group consisting of aluminum (Al), copper (Cu), silver (Ag), and zinc (Zn), and one or more of oxygen (O), tellurium (Te), sulfur (S), and selenium (Se).

5. The memory element according to claim 4, wherein the barrier layer is effective in controlling a movement of mobile ions of the at least one ionizing metallic element to the first electrode.

6. The memory element according to claim 1, wherein the intermediate layer is an electrolyte layer having a resistance higher than that of the ion source layer, and is enabled to receive mobile ions of an ionizing metallic element.

7. The memory element according to claim 1 wherein the intermediate layer contains at least a chalcogen element selected from the group consisting of Te, S and Se.

8. The memory element according to claim 7, wherein the intermediate layer contains Te and Al.

9. The memory element according to claim 1, wherein the resistance change layer contains (i) an oxide of a metallic element formed by a diffusion of mobile ions of the metallic element from at least one of the ion source layer and the intermediate layer, and (ii) an oxide of a transition metal.

10. The memory element according to claim 1, wherein the resistance change layer:
(i) is in a layered structure including (a) a layer containing an aluminum oxide formed by diffusion of Al contained at least either in the ion source layer or in the intermediate layer, and (b) a layer containing an oxide of a transition metal, or
(ii) is in a mixed structure of the aluminum oxide and the oxide of a transition metal.

11. The memory element according to claim 1, wherein a change of resistance value occurs by formation of a low-resistance section including a metallic element in the resistance change layer in response to application of a voltage to the first and second electrodes.

12. A memory device, comprising:
a plurality of memory elements, each memory element including a first electrode, a memory layer, and a second electrode in this order; and
a pulse application section applying a voltage or current pulse selectively to the memory elements,
wherein, the memory layer includes
(a) a resistance change layer on the first electrode,
(b) an ion source layer,
(c) an intermediate layer between the resistance change layer and the ion source layer, and
(d) a barrier layer between the ion source layer and the resistance change layer, the barrier layer having a surface in contact with the intermediate layer.

13. The memory device according to claim 12, wherein the barrier layer contains one or more of copper (Cu), titanium (Ti), zirconium (Zr), hafnium (Hf), vanadium (V), niobium (Nb), tantalum (Ta), chromium (Cr), molybdenum (Mo), or tungsten (W) as the at least one transition metal.

14. The memory device of claim 12, wherein the barrier layer is between the ion source layer and the intermediate layer.

15. The memory device of claim 12, wherein the barrier layer is between the intermediate layer and the resistance change layer.

16. The memory device of claim 12 where the intermediate layer contains, at least a chalcogen element selected from the group consisting of tellurium (Te), sulfur (S), and selenium (Se).

17. The memory device of claim 12 wherein the barrier layer contains a transition metal.

* * * * *